US009460646B2

(12) United States Patent
Hwang et al.

(10) Patent No.: US 9,460,646 B2
(45) Date of Patent: Oct. 4, 2016

(54) DISPLAY DEVICE AND BONDING TEST SYSTEM

(71) Applicant: Samsung Display Co., Ltd., Yongin, Gyeonggi-Do (KR)

(72) Inventors: Kyung-Ho Hwang, Yongin (KR); Dong-Hwan Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 423 days.

(21) Appl. No.: 13/919,419

(22) Filed: Jun. 17, 2013

(65) Prior Publication Data

US 2014/0117998 A1 May 1, 2014

(30) Foreign Application Priority Data

Nov. 1, 2012 (KR) ........................ 10-2012-0122854

(51) Int. Cl.
*G01R 31/14* (2006.01)
*G09G 3/00* (2006.01)

(52) U.S. Cl.
CPC .................................... *G09G 3/006* (2013.01)

(58) Field of Classification Search
CPC ..... G01R 31/25; G01R 31/02; G01R 19/145
See application file for complete search history.

(56) References Cited

U.S. PATENT DOCUMENTS

2007/0085962 A1* 4/2007 Yoshioka ............ G02F 1/13452 349/149
2008/0173900 A1* 7/2008 Yoon ..................... G02F 1/1345 257/203
2010/0139953 A1* 6/2010 Kim ....................... H05K 3/323 174/256
2010/0295567 A1* 11/2010 Chang .................. G01R 31/046 324/719
2011/0279765 A1* 11/2011 Oohira .............. G02F 1/133305 349/150
2012/0161660 A1* 6/2012 Joo .......................... G09G 3/20 315/240
2012/0161805 A1* 6/2012 Jung ...................... G09G 3/006 324/754.07
2012/0267779 A1* 10/2012 Lin ................... H01L 23/49838 257/737
2014/0062936 A1* 3/2014 Al-Dahle ................ G09G 3/36 345/174

FOREIGN PATENT DOCUMENTS

KR 10-2003-0065131 8/2003
KR 10-2006-0012164 2/2006
KR 10-2008-0057442 6/2008

* cited by examiner

*Primary Examiner* — Tung X Nguyen
*Assistant Examiner* — Dominic Hawkins
(74) *Attorney, Agent, or Firm* — Robert E. Bushnell, Esq.

(57) ABSTRACT

A display device includes a display panel having a glass substrate, a first input pad formed on the glass substrate and a second input pad formed on the glass substrate, and a driver integrated circuit mounted on the glass substrate of the display panel using a chip-on-glass (COG) method. The driver integrated circuit includes first and second input bumps respectively coupled to the first and second input pads, and an internal ground line coupled to the first and second input bumps. The first input bump of the driver IC receives a test signal through the first input pad when a COG bonding test is performed, and receives a ground voltage when the display device operates.

20 Claims, 9 Drawing Sheets

200a

200c

200d

DISPLAY DEVICE AND BONDING TEST SYSTEM

CLAIM OF PRIORITY

This application makes reference to, incorporates the same herein, and claims all benefits accruing under 35 U.S.C. §119 from an application earlier filed in the Korean Intellectual Property Office on 1 Nov. 2012 and there duly assigned Ser. No. 10-2012-0122854.

BACKGROUND OF THE INVENTION

1. Field of the Invention

An embodiment of the present invention relates to display devices, and more particularly, to display devices where chip-on-glass (COG)/film-on-glass (FOG) bonding tests are performed and to the bonding test systems.

2. Description of the Related Art

In a display device, a driver integrated circuit (IC) may be mounted on a display panel using a chip-on-glass (COG) method, a tape carrier package (TCP) method, a chip-on-film (COF) method, etc. In comparison with the TCP method and the COF method, the COG method is simpler and may increase the relative size of a displaying region in the display panel. Therefore, the COG method is recently widely used.

When the driver IC is directly mounted on the display panel by using the COG method, connection resistance, which may be referred to as bonding resistance or COG bonding resistance, is incurred at the connection between the display panel and the driver IC. When the bonding resistance is increased due to a COG process variation, an IC bump shape, a pad resistance variation or the like, functions of the display device may deteriorate. Thus, it is desirable to measure the bonding resistance.

In a contemporary display device, at least one pair of bumps or pins is additionally formed per the driver IC to measure the bonding resistance. For example, to measure the bonding resistance, three pairs of dedicated bumps for the bonding resistance measurement may be formed at a left portion, a right portion and a center portion of each driver IC, respectively, and three pairs of pads may be formed corresponding to the three pairs of the dedicated bumps on the display panel. Since additional bumps are formed to measure the bonding resistance, the number of bumps or pins is disadvantageously increased in the contemporary display device.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments of the present invention provide a display device capable of reducing the number of dedicated bumps for bonding resistance measurement.

Embodiments of the present invention provide a bonding test system automatically measuring bonding resistance and capable of reducing the number of dedicated bumps for bonding resistance measurement.

In accordance with one aspect of embodiments of the present invention, a display device may include a display panel including a glass substrate, a first input pad formed on the glass substrate, and a second input pad formed on the glass substrate, and a driver integrated circuit (IC) mounted on the glass substrate of the display panel using a chip-on-glass (COG) method, the driver integrated circuit including a first input bump coupled to the first input pad, a second input bump coupled to the second input pad, and an internal ground line coupled to the first and second input bumps. When a COG bonding test for the glass substrate and the driver IC is performed by a bonding test device, the first input bump of the driver IC is configured to receive a test signal from the bonding test device through the first input pad, and is configured to provide the test signal to the bonding test device through the internal ground line, the second input bump and the second input pad. When the display device operates, the first input bump of the driver IC is configured to receive a ground voltage through the first input pad, and is configured to provide the ground voltage to the internal ground line.

In embodiments of the present invention, the bonding test device may perform the COG bonding test by measuring a resistance of a path of the test signal including a first bonding resistance between the first input pad and the first input bump and a second bonding resistance between the second input pad and the second input bump.

In embodiments of the present invention, the second input bump of the driver IC may be a ground input bump configured to receive the ground voltage through the second input pad and to provide the ground voltage to the internal ground line when the display device operates.

In embodiments of the present invention, the second input bump of the driver IC may be a signal input bump configured to receive a data signal through the second input pad when the display device operates.

In embodiments of the present invention, the driver IC may further include a diode coupled between the internal ground line and the second input bump. The diode may be configured to transfer the test signal from the internal ground line to the second input bump when the COG bonding test is performed, and is configured to prevent the data signal from being transferred from the second input bump to the internal ground line when the display device operates.

In embodiments of the present invention, at least one of the first input bump and the second input bump may be located at a center portion of the driver IC.

In embodiments of the present invention, at least one of the first input bump and the second input bump may be located at a side portion of the driver IC.

In embodiments of the present invention, the second input bump may be located at a center portion of the driver IC, and the driver IC may further include a third input bump coupled to the internal ground line and located at a left side portion of the driver IC, and a fourth input bump coupled to the internal ground line and located at a right side portion of the driver IC. The bonding test device may perform the COG bonding test for the glass substrate and the center portion of the driver IC using a first path including the first input bump, the internal ground line and the second input bump, may perform the COG bonding test for the glass substrate and the left side portion of the driver IC using a second path including the first input bump, the internal ground line and the third input bump, and may perform the COG bonding test for the glass substrate and the right side portion of the driver IC using a third path including the first input bump, the internal ground line and the fourth input bump.

In embodiments of the present invention, the display panel may further include a third input pad formed on the glass substrate, a first output pad formed on the glass substrate, a second output pad formed on the glass substrate, and a first connecting line coupling the first output pad to the second output pad. The driver IC may further include a first output bump coupled to the internal ground line and the first output pad, a second output bump coupled to the second output pad, a third input bump coupled to the third input pad, and a second connecting line coupling the second output bump to the third input bump. The bonding test device may perform the COG bonding test using a path including the first input pad, the first input bump, the internal ground line, the first output pad, the first connecting line, the second output pad, the second output bump, the second connecting line, the third input bump and the third input pad.

In embodiments of the present invention, the bonding test device may perform the COG bonding test by measuring a resistance of the path including a first bonding resistance between the first input pad and the first input bump, a second bonding resistance between the first output pad and the first output bump, a third bonding resistance between the second output pad and the second output bump, and a fourth bonding resistance between the third input pad and the third input bump.

In embodiments of the present invention, the display device may further comprise a flexible printed circuit (FPC) mounted on the glass substrate using a film-on-glass (FOG) method, the FPC coupled to the bonding test device when the COG bonding test is performed.

In embodiments of the present invention, the display panel may further include first and second FPC pads formed on the glass substrate, and first and second connecting lines coupling the first and second input pads to the first and second FPC pads, respectively. The FPC may include a first FPC bump coupled to the first FPC pad, a second FPC bump coupled to the second FPC pad, a first FPC line coupled to the first FPC bump, and a second FPC line coupled to the second FPC bump. The bonding test device may perform the COG bonding test for the glass substrate and the driver IC and a FOG bonding test for the glass substrate and the FPC by applying the test signal to the first FPC line and by receiving the applied test signal through a path including the first FPC line, the first FPC bump, the first FPC pad, the first connecting line, the first input pad, the first input bump, the internal ground line, the second input bump, the second input pad, the second connecting line, the second FPC pad, the second FPC bump and the second FPC line.

In embodiments of the present invention, the bonding test device may perform the COG bonding test and the FOG bonding test by measuring a resistance of the path including a first bonding resistance between the first FPC pad and the first FPC bump, a second bonding resistance between the first input pad and the first input bump, a third bonding resistance between the second input pad and the second input bump, and a fourth bonding resistance between the second FPC pad and the second FPC bump.

In accordance with another aspect of embodiments of the present invention, there is provided a display device comprising a display panel including a glass substrate, first and second input pads formed on the glass substrate, first and second output pads formed on the glass substrate, and a first connecting line coupling the first output pad to the second output pad, and a driver integrated circuit (IC) mounted on the glass substrate of the display panel using a chip-on-glass (COG) method, the driver integrated circuit including first and second input bumps respectively coupled to the first and second input pads, first and second output bumps respectively coupled to the first and second output pads, an internal ground line coupled to the first input bump and the first output bump, and a second connecting line coupling the second output bump to the second input bump. When a COG bonding test for the glass substrate and the driver IC is performed by a bonding test device, the first input bump of the driver IC is configured to receive a test signal from the bonding test device through the first input pad, and is configured to provide the test signal to the bonding test device through the internal ground line, the first output bump, the first output pad, the first connecting line, the second output pad, the second output bump, the second connecting line, the second input bump and the second input pad. When the display device operates, the first input bump of the driver IC is configured to receive a ground voltage through the first input pad, and is configured to provide the ground voltage to the internal ground line.

In embodiments of the present invention, the bonding test device may perform the COG bonding test by measuring a resistance of a path of the test signal including a first bonding resistance between the first input pad and the first input bump, a second bonding resistance between the first output pad and the first output bump, a third bonding resistance between the second output pad and the second output bump and a fourth bonding resistance between the second input pad and the second input bump.

In embodiments of the present invention, the first output bump and the second output bump may be located adjacent to each other.

In embodiments of the present invention, at least one of the first output bump and the second output bump may be located at a center portion of the driver IC.

In embodiments of the present invention, at least one of the first output bump and the second output bump may be located at a side portion of the driver IC.

In embodiments of the present invention, at least one of the second input bump, the first output bump and the second output bump may be a dummy bump.

In accordance with still another aspect of embodiments of the present invention, a bonding test system may include a display device and a bonding test device. The display device may include a display panel including a glass substrate, a first input pad formed on the glass substrate, and a second input pad formed on the glass substrate, a driver integrated circuit (IC) mounted on the glass substrate of the display panel using a chip-on-glass (COG) method, the driver integrated circuit including a first input bump coupled to the first input pad, a second input bump coupled to the second input pad, and an internal ground line coupled to the first and second input bumps, and a flexible printed circuit (FPC) mounted on the glass substrate using a film-on-glass (FOG) method. The bonding test device is coupled to the FPC. The bonding test device is configured to perform a COG bonding test for the glass substrate and the driver IC using a path including the first input pad, the first input bump, the internal ground line, the second input bump and the second input pad.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
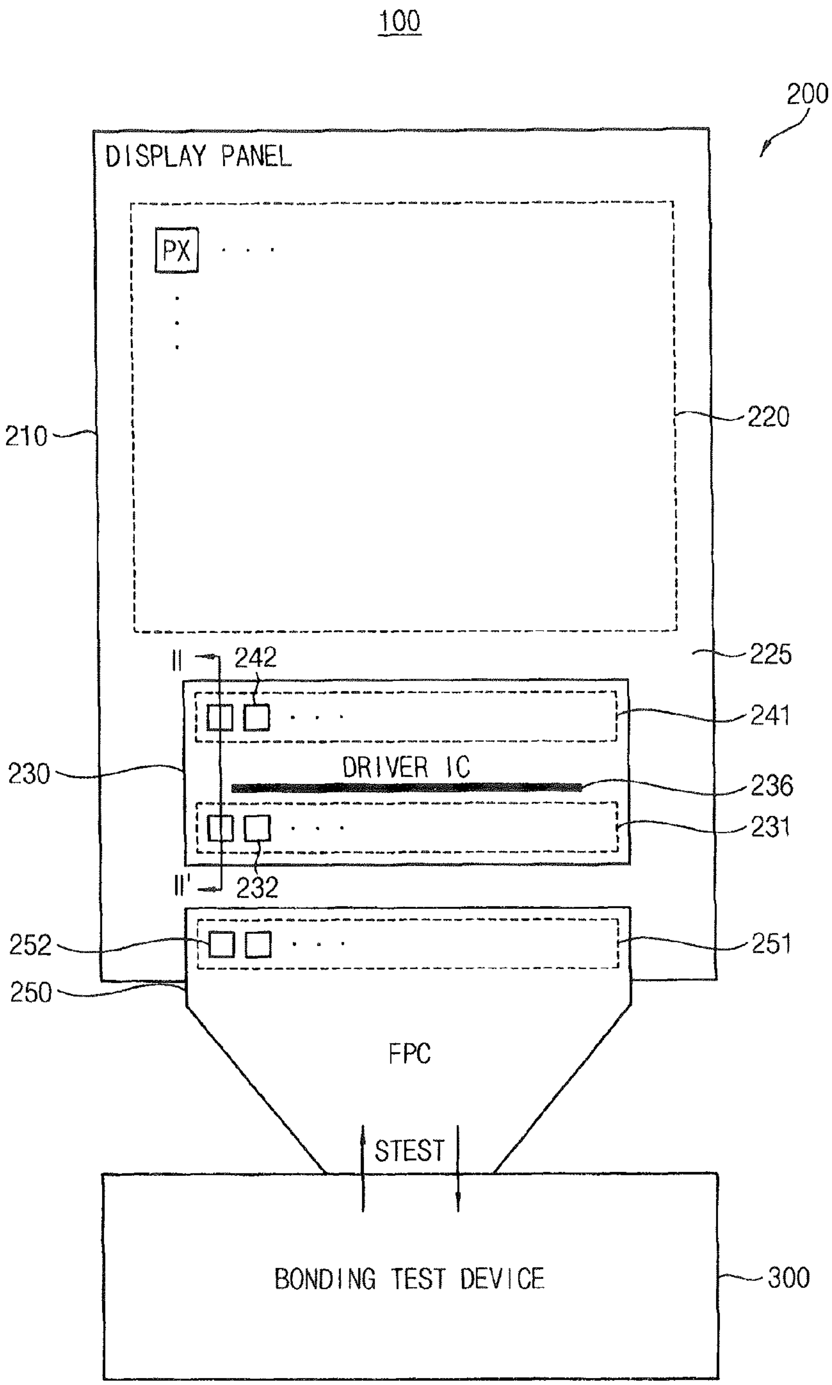
FIG. 1 is a block diagram illustrating a bonding test system including a display device and a bonding test device in accordance with example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a bonding test system including a display device and a bonding test device in accordance with example embodiments.

In reference to FIG. 1, a bonding test system 100 includes a display device 200 and a bonding test device 300.

The display device 200 is coupled to the bonding test device 300 performing a bonding test for the display device 200 when the bonding test is performed, and is coupled to an external control device controlling an operation of the display device 200 when the display device 200 operates after the bonding test is completed. In accordance with example embodiments, the display device 200 may be any display device, such as a liquid crystal display (LCD) device, an organic light emitting diode (OLED) display device, a plasma display panel (PDP) display device, etc. The display device 200 may include a display panel 210, a driver integrated circuit (IC) 230 and a flexible printed circuit (FPC) 250.

The display panel 210 may include a displaying region 220 where a plurality of pixels PX are formed and a non-displaying portion 225 on which the driver IC 230 is mounted. The plurality of pixels PX may be formed in a matrix form having a plurality of rows and a plurality of columns.

The driver IC 230 may be mounted on the non-displaying portion 225 of the display panel 210 using a chip-on-glass (COG) method. For example, the driver IC 230 may be mounted on a glass substrate of the display panel 210 by disposing an anisotropic conductive film (ACF) between the driver IC 230 and the glass substrate and by pressing at high temperature. In accordance with example embodiments, the driver IC 230 may be a data driver IC applying a data voltage to the displaying region 220 of the display panel 210, a scan driver IC applying a gate voltage to the displaying region 220 of the display panel 210, or an integrated driver IC where the data driver and the scan driver are integrated. Even though FIG. 1 illustrates an example of the display device 200 where one driver IC 230 is mounted on the display panel 210, it should be understood that in some other example embodiments, a plurality of driver ICs may be mounted on the display panel 210.

The driver IC 230 may include an input bump unit 231 for receiving a signal from an external device (e.g., the bonding test device 300 or the external control device) through the FPC 250, an output bump unit 241 for transferring a signal to the displaying region 220 of the display panel 210, and an internal ground line 236 for providing a ground voltage to the driver IC 230.

The input bump unit 231 may include a plurality of input bumps 232 arranged in a predetermined form (e.g., in a straight line). In accordance with example embodiments, each input bump may be formed of a conductive material, such as gold (Au), copper (Cu), nickel (Ni), etc., but not limited thereto. The plurality of input bumps may be respectively coupled to a plurality of input pads formed on the glass substrate of the display panel 210 using the COG method. The driver IC 230 may receive a power supply voltage, the ground voltage, a data signal, etc. through the plurality of input pads and the plurality of input bumps.

The output bump unit 241 may include a plurality of output bumps 242 arranged in a predetermined form (e.g., in a straight line). In accordance with example embodiments, each output bump may be formed of a conductive material, such as gold (Au), copper (Cu), nickel (Ni), etc., but not limited thereto. The plurality of output bumps may be respectively coupled to a plurality of output pads formed on the glass substrate of the display panel 210 using the COG method. The driver IC 230 may provide the data voltage, the gate voltage, etc. through the plurality of output bumps and the plurality of output pads.

While the display device 200 operates, the internal ground line 236 may receive the ground voltage (e.g., a system ground voltage) through at least one ground input bump among the plurality of input bumps, and may provide the ground voltage to the driver IC 230. While the bonding test is performed, the internal ground line 236 may receive a test signal STEST generated by the bonding test device 300 through the ground input bump, and may provide the test signal STEST to the bonding test device 300 through another input bump. In a contemporary display device, dedicated bumps for the bonding test are additionally formed. However, in the display device 200 according to example embodiments, since the bonding test is performed using the ground input bump and the internal ground line 236, the dedicated bumps for the boding test may be removed or reduced.

Further, the FPC 250 may be mounted on the non-displaying portion 225 of the display panel 210 using a film-on-glass (FOG) method. For example, the FPC 250 may be mounted on the glass substrate of the display panel 210 by disposing an ACF between the FPC 250 and the glass substrate and by pressing at high temperature. The FPC 250 may be coupled to the bonding test device 300 providing the test signal STEST when the bonding test is performed, and may be coupled to the external control device providing the data signal including image data and control data to control the operation of the display device 200 when the display device 200 operates.

The FPC 250 may include an FPC bump unit 251 for transferring a signal receive from an external device (e.g., the bonding test device 300 or the external control device) to the display panel 210 and the driver IC 230. The FPC bump unit 251 may include a plurality of FPC bumps 252 arranged in a predetermined form (e.g., in a straight line). In accordance with example embodiments, each FPC bump may be formed of a conductive material, such as gold (Au), copper (Cu), nickel (Ni), etc., but not limited thereto. The plurality of FPC bumps may be respectively coupled to a plurality of FPC pads formed on the glass substrate of the display panel 210 using the FOG method.

The bonding test device 300 may perform a COG bonding test for the glass substrate and the driver IC 230 and/or a FOG bonding test for the glass substrate and the FPC 250 by applying the test signal STEST to the display device 200 and by receiving the test signal STEST output through a path including the internal ground line 236 of the driver IC 230, an input bump of the driver IC 230 and an FPC bump of the FPC 250. For example, to perform the COG bonding test and/or the FOG bonding test, the bonding test device 300 may apply the test signal STEST having a constant current or a constant voltage to the display device 200, and may measure a voltage drop through the path of the test signal STEST. With respect to contemporary mass-produced display devices, the COG bonding test and/or the FOG bonding test are manually performed on only sampled ones of the mass-produced display devices. The bonding test system 100 according to example embodiments however may automatically perform the COG bonding test and/or the FOG bonding test using the bonding test device 300, and thus may perform the COG bonding test and/or the FOG bonding test on all the mass-produced display devices.

As described above, the display device 200 and the bonding test system 100 according to example embodiments may perform the bonding test using the ground bump and the internal ground line 236 of the driver IC 230, thereby removing or reducing the dedicated bumps for the bonding test. Further, the display device 200 and the bonding test system 100 according to example embodiments may automatically perform the bonding test on all the mass-produced display devices.

Figure 2:
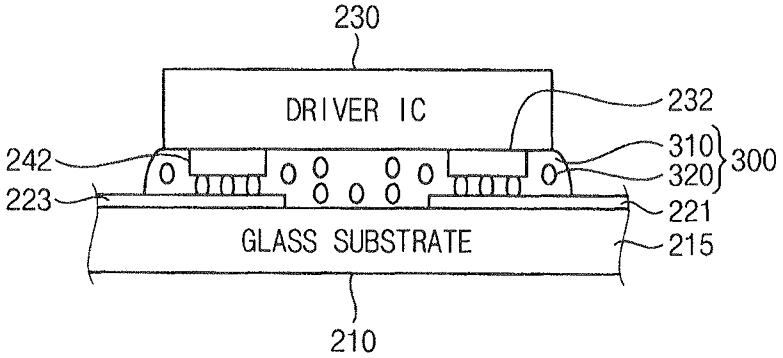
FIG. 2 is a cross-sectional view of an example of the display device taken along a line II-II' of FIG. 1.

FIG. 2 is a cross-sectional view of an example of the display device taken along a line II-II' of FIG. 1.

In reference to FIG. 2, a display panel 210 may include a glass substrate 215, an input pad 221 formed on the glass substrate 215, and an output pad 223 formed on the glass substrate 215. A driver IC 230 may include an input bump 232 and an output bump 242 formed on a lower surface of the driver IC 230.

The driver IC 230 may be mounted on the glass substrate 215 of the display panel 210 by disposing an anisotropic conductive film (ACF) 300 between the driver IC 230 and the glass substrate 215 and by pressing at high temperature. For example, the ACF 300 may include an adhesive resin 310 and a plurality of conductive particles 320 that are randomly dispersed inside the adhesive resin 310. The conductive particles 320 may be deformed by the pressure applied during the COG process such that the input pad 221 of the display panel 210 is electrically coupled to the input bump 232 of the driver IC 230 and the output pad 223 of the display panel 210 is electrically coupled to the output bump 242 of the driver IC 230.

If the input pad 221 is electrically coupled to the input bump 232 and the output pad 223 is electrically coupled to the output bump 242 in such a manner, COG bonding resistances may be incurred between the input pad 221 and the input bump 232 and between the output pad 223 and the output bump 242. In a case where the COG bonding resistance exceeds a predetermined range due to a COG process variation, an IC bump shape, a pad resistance variation or the like, performance of a display panel may deteriorate. Thus, a display device and a bonding test system according to example embodiments may perform a COG bonding test for the glass substrate 215 and the driver IC 230 by measuring the COG bonding resistance between the input pad 221 and the input bump 232 and/or the COG bonding resistance between the output pad 223 and the output bump 242. Similarly, an FOG bonding resistance may be incurred between an FOG pad and an FOG bump, and the display device and the bonding test system according to example embodiments may perform an FOG bonding test for the glass substrate 215 and an FPC by measuring the FOG bonding resistance between the FOG pad and the FOG bump.

Figure 3:
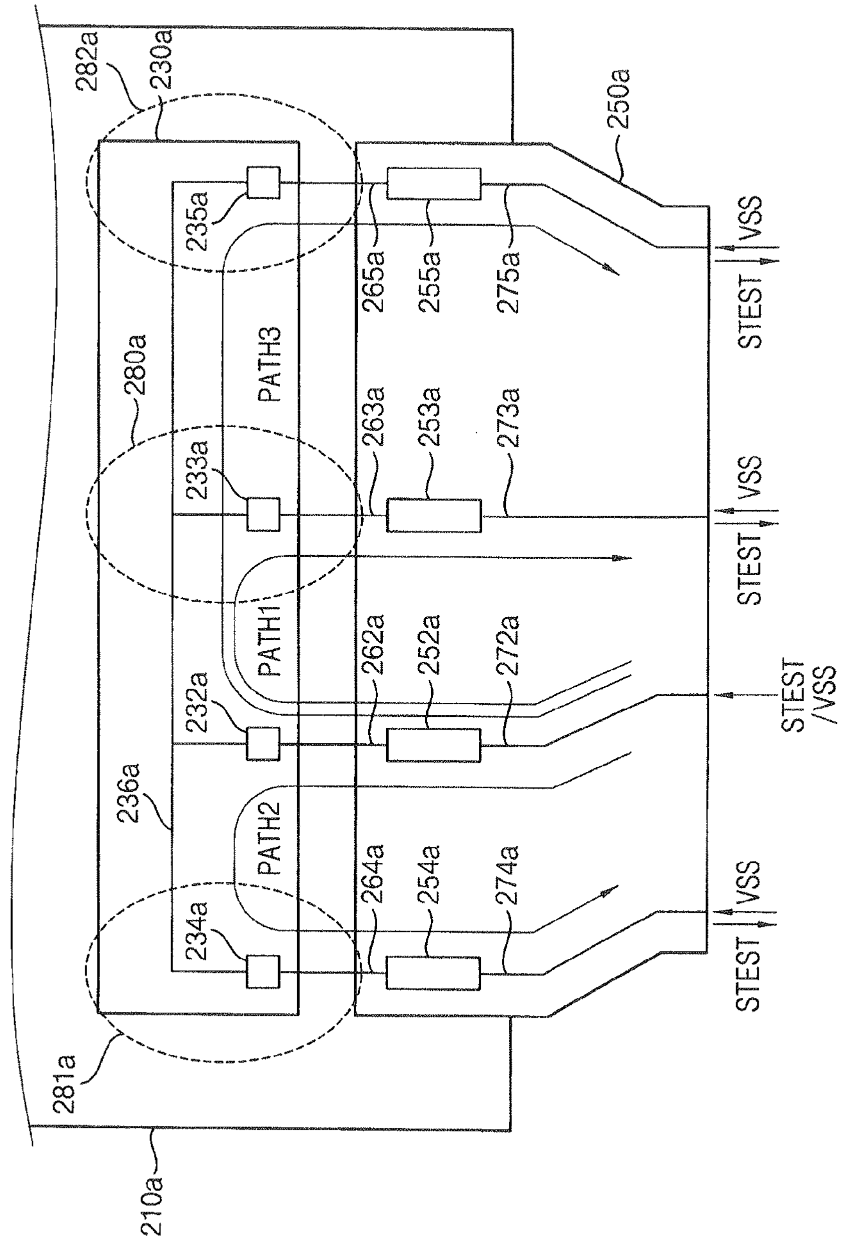
FIG. 3 is a diagram illustrating a display device in accordance with example embodiments.
Figure 4:
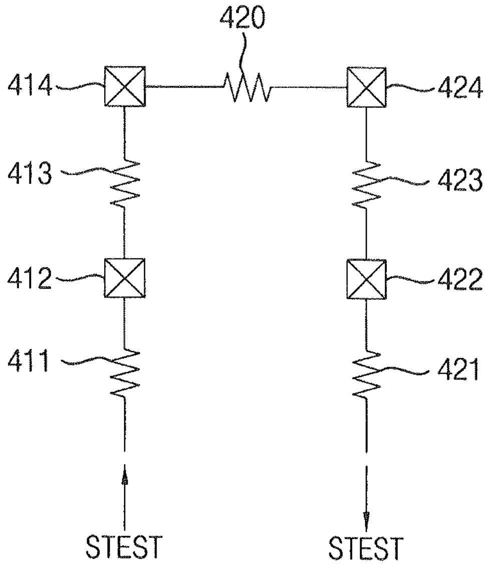
FIG. 4 is an equivalent circuit diagram of a test signal path illustrated in FIG. 3.

FIG. 3 is a diagram illustrating a display device in accordance with example embodiments, and FIG. 4 is an equivalent circuit diagram of a test signal path illustrated in FIG. 3.

In reference to FIG. 3, a display device 200*a* includes a display panel 210*a*, a driver IC 230*a* and an FPC 250*a*.

The display panel 210*a* may include a glass substrate, first and second input pads formed corresponding to first and second input bumps 232*a* and 233*a* on the glass substrate, first and second FPC pads formed corresponding to first and second FPC bumps 252*a* and 253*a* on the glass substrate, and first and second connection lines 262*a* and 263*a* coupling the first and second input pads to the first and second FPC pads, respectively.

The driver IC 230*a* may be mounted on the glass substrate of the display panel 210*a* using a COG method. The driver IC 230*a* may include the first input bump 232*a* coupled to the first input pad, the second input bump 233*a* coupled to the second input pad, and an internal ground line 236*a* coupled to the first and second input bumps 232*a* and 233*a*.

The FPC 250*a* may be mounted on the glass substrate of the display panel 210*a* using an FOG method. The FPC 250*a* may include the first FPC bump 252*a* coupled to the first FPC pad, the second FPC 253*a* coupled to the second FPC pad, a first FPC line 272*a* coupled to the first FPC bump 252*a*, and a second FPC line 273*a* coupled to the second FPC bump 253*a*.

The display device 200*a* may be coupled to a bonding test device when a bonding test including a COG bonding test and/or an FOG bonding test is performed. The bonding test device may apply a test signal STEST having a constant current or a constant voltage to the first FPC line 272*a*. The applied test signal STEST may pass through a first path PATH1 including the first FPC line 272*a*, the first FPC bump 252*a*, the first FPC pad, the first connecting line 262*a*, the first input pad, the first input bump 232*a*, the internal ground line 236*a*, the second input bump 233*a*, the second input pad, the second connecting line 263*a*, the second FPC pad, the second FPC bump 253*a* and the second FPC line 273*a*, and then may return to the bonding test device.

The first path PATH1 may be expressed as an equivalent circuit illustrated in FIG. 4. For example, referring to FIGS. 3 and 4, the first path PATH1 may be expressed as the equivalent circuit having a first resistance 411 of the first FPC line 272*a*, a first bonding resistance 412 between the first FPC bump 252*a* and the first FPC pad, a second resistance 413 of the first connecting line 262*a*, a second bonding resistance 414 between the first input pad and the first input bump 232*a*, a third resistance 420 of the internal ground line 236*a*, a third bonding resistance 424 between the second input bump 233*a* and the second input pad, a fourth resistance 423 of the second connecting line 263*a*, a fourth bonding resistance 422 between the second FPC pad and the second FPC bump 253*a*, and a fifth resistance 421 corresponding to the second FPC line 273*a*.

Since the first through fifth resistances 411, 413, 420, 421 and 423 have substantially fixed values lower than those of the first through fourth bonding resistances 412, 414, 422 and 424, the bonding test device may check whether the first through fourth bonding resistances 412, 414, 422 and 424 exceed a predetermined range by measuring a resistance of the first path PATH1. For example, in a case where the resistance of the first path PATH1 is higher than a predetermined value, the bonding test device may determine that the first through fourth bonding resistances 412, 414, 422 and 424 exceed the predetermined range, and may decide that the COG bonding between the glass substrate and the driver IC 230*a* and the FOG bonding between the glass substrate and the FPC 250*a* are poor. As described above, the bonding test device may perform the COG bonding test for the glass substrate and the driver IC 230*a* and the FOG bonding test for the glass substrate and the FPC 250*a* by measuring the resistance of the first path PATH1 of the test signal STEST including the first bonding resistance 412 between the first FPC bump 252*a* and the first FPC pad, the second bonding resistance 414 between the first input pad and the first input bump 232*a*, the third bonding resistance 424 between the second input bump 233*a* and the second input pad and the fourth bonding resistance 422 between the second FPC pad and the second FPC bump 253*a*.

The first input bump 232*a* to which the test signal STEST is applied when the COG bonding test is performed may be a ground input bump for providing a ground voltage VSS (e.g., a system ground voltage) to the internal ground line 236*a* when the display device 200*a* operates. That is, when the COG bonding test is performed, the first input bump 232*a* may receive the test signal STEST from the bonding test device through the first input pad, and may provide the test signal STEST to the bonding test device through the internal ground line 236*a*, the second input bump 233*a* and the second input pad. Further, when the display device 200*a* operates, the first input bump 232*a* may receive the ground voltage VSS through the first input pad, and may provide the ground voltage VSS to the internal ground line. Accordingly, in the display device 200*a* according to example embodiments, since the COG bonding test is performed using the ground input bump and the internal ground line 236*a*, the dedicated bumps for the boding test may be removed or reduced.

In some example embodiments, the second input bump 233*a* included in the first path PATH1 through which the test signal STEST passes when the COG bonding test is performed may also be the ground input bump that receives the ground voltage VSS through the second FPC line 273*a*, the second FPC bump 253*a*, the second FPC pad, the second connecting line 263*a* and the second input pad and provides the received ground voltage VSS to the internal ground line 236*a*. Accordingly, in the display device 200*a* according to example embodiments, the COG bonding test may be performed without dedicated bumps for bonding resistance measurement.

In some example embodiments, at least one of the first input bump 232*a* and the second input bump 233*a* may be located at a center portion 280*a* of the driver IC 230*a*. Thus, the COG bonding test for the center portion 280*a* of the driver IC 230*a* may be performed. In other example embodiments, at least one of the first input bump 232*a* and the second input bump 233*a* may be located at a left side portion 281*a* or a right side portion 282*a* of the driver IC 230*a*. Thus, the COG bonding test for the left side portion 281*a* or the right side portion 282*a* of the driver IC 230*a* may be performed.

In still other example embodiments, the second input bump 233*a* may be located at the center portion 280*a* of the driver IC 230*a*, and the driver IC 230*a* may further include a third input bump 234*a* coupled to the internal ground line 236*a* and located at the left side portion 281*a* of the driver IC 230*a*, and a fourth input bump 235*a* coupled to the internal ground line 236*a* and located at the right side portion 282*a* of the driver IC 230*a*. In this case, the COG bonding test for the center portion 280*a*, the left side portion 281*a* and the right side portion 282*a* of the driver IC 230*a* may be performed. For example, the COG bonding test for the glass substrate and the center portion 280*a* of the driver IC 230*a* and/or the FOG bonding test for the glass substrate and the FPC 250*a* may be performed using the first path PATH1 including the first FPC line 272*a*, the first FPC bump 252*a*, the first FPC pad, the first connecting line 262*a*, the first input pad, the first input bump 232*a*, the internal ground line 236*a*, the second input bump 233*a*, the second input pad, the second connecting line 263*a*, the second FPC pad, the second FPC bump 253*a* and the second FPC line 273*a*. Further, the COG bonding test for the glass substrate and the left side portion 281*a* of the driver IC 230*a* and/or the FOG bonding test for the glass substrate and the FPC 250*a* may be performed using a second path PATH2 including the first FPC line 272*a*, the first FPC bump 252*a*, the first FPC pad, the first connecting line 262*a*, the first input pad, the first input bump 232*a*, the internal ground line 236*a*, the third input bump 234*a*, a third input pad, a third connecting line 264*a*, a third FPC pad, a third FPC bump 254*a* and a third FPC line 274*a*. Further, the COG bonding test for the glass substrate and the right side portion 282*a* of the driver IC 230*a* and/or the FOG bonding test for the glass substrate and the FPC 250*a* may be performed using a third path PATH3 including the first FPC line 272*a*, the first FPC bump 252*a*, the first FPC pad, the first connecting line 262*a*, the first input pad, the first input bump 232*a*, the internal ground line 236*a*, the fourth input bump 235*a*, a fourth input pad, a fourth connecting line 265*a*, a fourth FPC pad, a fourth FPC bump 255*a* and a fourth FPC line 275*a*.

As described above, in the display device 200*a* according to example embodiments, since the COG bonding test and/or the FOG bonding test are performed using the ground input bump and the internal ground line 236*a*, the dedicated bumps for the boding test may be removed or reduced.

Figure 5:
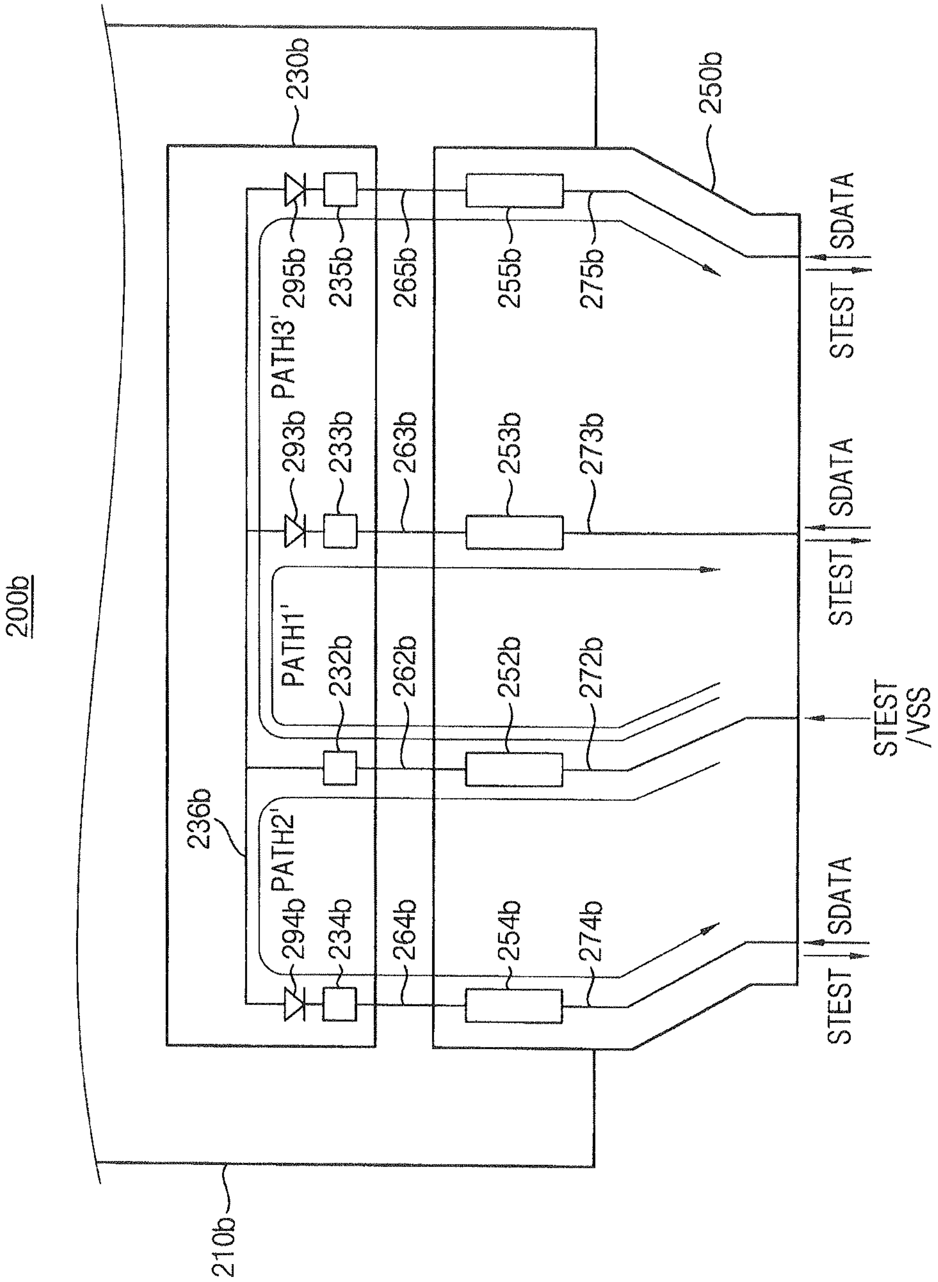
FIG. 5 is a diagram illustrating a display device in accordance with example embodiments.

FIG. 5 is a diagram illustrating a display device in accordance with example embodiments.

In reference to FIG. 5, a display device 200*b* includes a display panel 210*b*, a driver IC 230*b* and an FPC 250*b*. Unlike second through fourth input bumps 233*a*, 234*a* and 235*a* illustrated in FIG. 3 that are ground input bumps, second through fourth input bumps 233*b*, 234*b* and 235*b* illustrated in FIG. 5 may be signal input bumps for receiving a data signal SDATA including image data or control data.

The display panel 210*b* may include a glass substrate, first through fourth input pads formed corresponding to first through fourth input bumps 232*b*, 233*b*, 234*b* and 235*b* on the glass substrate, first through fourth FPC pads formed corresponding to first through fourth FPC bumps 252*b*, 253*b*, 254*b* and 255*b* on the glass substrate, and first through fourth connection lines 262*b*, 263*b*, 264*b* and 265*b* coupling the first fourth input pads to the first through fourth FPC pads, respectively.

The driver IC 230*b* may be mounted on the glass substrate of the display panel 210*b* using a COG method. The driver IC 230*b* may include the first through fourth input bumps 232*b*, 233*b*, 234*b* and 235*b* respectively coupled to the first through fourth input pads, an internal ground line 236*a* coupled to the first through fourth input bumps 232*b*, 233*b*, 234*b* and 235*b*, and first through third diodes 293*b*, 294*b* and 295*b* coupled between the second through fourth input bumps 233*b*, 234*b* and 235*b* and the internal ground line 236*b*, respectively. The first through third diodes 293*b*, 294*b* and 295*b* may transfer a test signal STEST from the internal ground line 236*b* to the second through fourth input bumps 233*b*, 234*b* and 235*b* when a bonding test is performed, and may prevent the data signal SDATA from being transferred from the second through fourth input bumps 233*b*, 234*b* and 235*b* to the internal ground line 236*b* when the display device 200*b* operates.

The FPC 250*b* may be mounted on the glass substrate of the display panel 210*b* using an FOG method. The FPC 250*b* may include the first through fourth FPC bumps 252*b*, 253*b*, 254*b* and 255*b* respectively coupled to the first through fourth FPC pads, and first through fourth FPC lines 272*b*, 273*b*, 274*b* and 275*b* respectively coupled to the first through fourth FPC bumps 252*b*, 253*b*, 254*b* and 255*b*.

The display device 200*b* may be coupled to a bonding test device when the bonding test including a COG bonding test and/or an FOG bonding test is performed. The bonding test device may perform the COG bonding test and/or the FOG bonding test using a first path PATH1' including the first FPC line 272*b*, the first FPC bump 252*b*, the first FPC pad, the first connecting line 262*b*, the first input pad, the first input bump 232*b*, the internal ground line 236*b*, the first diode 293*b*, the second input bump 233*b*, the second input pad, the second connecting line 263*b*, the second FPC pad, the second FPC bump 253*b* and the second FPC line 273*b*. Further, the bonding test device may perform the COG bonding test and/or the FOG bonding test for a left side portion and/or a right side portion as well as a center portion using a second path PATH2' including the first FPC line 272*b*, the first FPC bump 252*b*, the first FPC pad, the first connecting line 262*b*, the first input pad, the first input bump 232*b*, the internal ground line 236*b*, the second diode 294*b*, the third input bump 234*b*, the third input pad, the third connecting line 264*b*, the third FPC pad, the third FPC bump 254*b* and the third FPC line 274*b* and/or using a third path PATH3' including the first FPC line 272*b*, the first FPC bump 252*b*, the first FPC pad, the first connecting line 262*b*, the first input pad, the first input bump 232*b*, the internal ground line 236*b*, the third diode 295*b*, the fourth input bump 235*b*, the fourth input pad, the fourth connecting line 265*b*, the fourth FPC pad, the fourth FPC bump 255*b* and the fourth FPC line 275*b*.

The first input bump 232*b* may be a ground input bump for receiving a ground voltage VSS when the display device 200*b* operates, and the second through fourth input bumps 233*b*, 234*b* and 235*b* may be signal input bumps for receiving the data signal SDATA including the image data or the control data through the second through fourth input pads when the display device 200*b* operates. Accordingly, in the display device 200*b* according to example embodiments, the COG bonding test and/or the FOG bonding test may be performed using the ground input bump and/or the signal input bump instead of dedicated bumps for bonding resistance measurement. Further, although the data signal SDATA is applied to the first through third diodes 293*b*, 294*b* and 295*b*, the data signal SDATA may be prevented by the first through third diodes 293*b*, 294*b* and 295*b* from being transferred from the second through fourth input bumps 233*b*, 234*b* and 235*b* to the internal ground line 236*b*.

As described above, in the display device 200*b* according to example embodiments, since the COG bonding test and/or the FOG bonding are performed using the ground input bump, the signal input bump and the internal ground line 236*b*, the dedicated bumps for the boding test may be removed or reduced.

Figure 6:
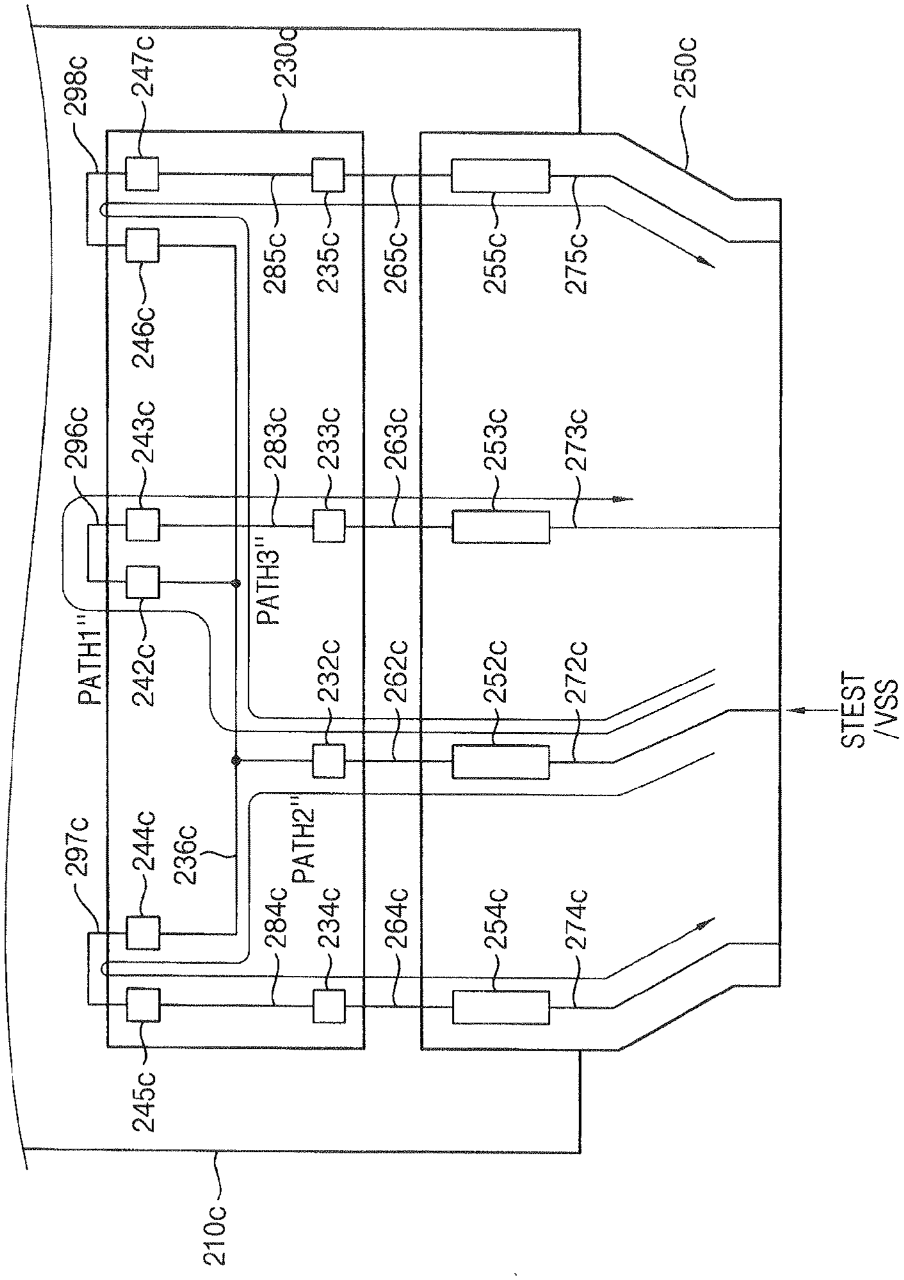
FIG. 6 is a diagram illustrating a display device in accordance with example embodiments.
Figure 7:
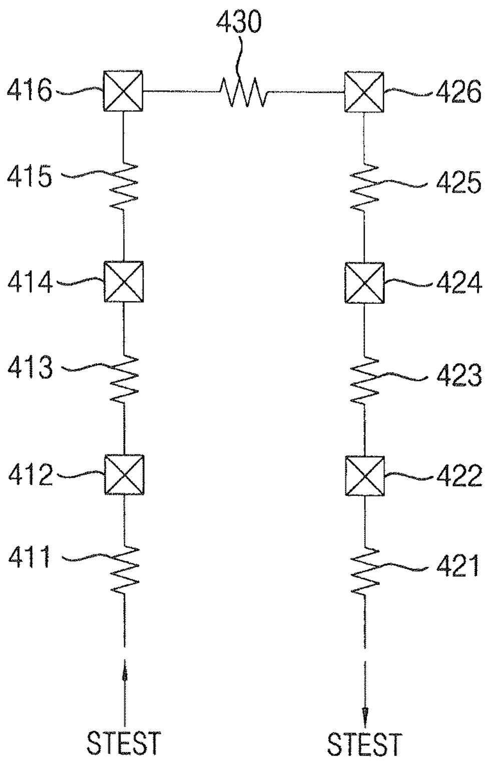
FIG. 7 is an equivalent circuit diagram of a test signal path illustrated in FIG. 6.

FIG. 6 is a diagram illustrating a display device in accordance with example embodiments, and FIG. 7 is an equivalent circuit diagram of a test signal path illustrated in FIG. 6.

In reference to FIG. 6, a display device 200*c* includes a display panel 210*c*, a driver IC 230*c* and an FPC 250*c*. The display device 200*c* of FIG. 6 may measure not only a COG input bonding resistance but also a COG output bonding resistance to perform a bonding test.

The display panel 210*c* may include a glass substrate, first and second input pads formed corresponding to first and second input bumps 232*c* and 233*c* on the glass substrate, first and second output pads formed corresponding to first and second output bumps 242*c* and 243*c* on the glass substrate, first and second FPC pads formed corresponding to first and second FPC bumps 252*c* and 253*c* on the glass substrate, first and second connection lines 262*c* and 263*c* coupling the first and second input pads to the first and second FPC pads, respectively, and a third connection line 296*c* coupling the first output pad to the second output pad.

The driver IC 230*c* may be mounted on the glass substrate of the display panel 210*c* using a COG method. The driver IC 230*c* may include the first and second input bumps 232*c* and 233*c* respectively coupled to the first and second input pads, the first and second output bumps 242*c* and 243*c* respectively coupled to the first and second output pads, an internal ground line 236*c* coupled to the first input bump 232*c* and the first output bump 242*c*, and a fourth connection line 283*c* coupling the second output bump 243*c* to the second input bump 233*c*.

The FPC 250*c* may be mounted on the glass substrate of the display panel 210*c* using an FOG method. The FPC 250*c* may include the first and second FPC bumps 252*c* and 253*c* respectively coupled to the first and second FPC pads, and first and second FPC lines 272*c* and 273*c* respectively coupled to the first and second FPC bumps 252*c* and 253*c*.

The display device 200*c* may be coupled to a bonding test device when the bonding test including a COG bonding test and/or an FOG bonding test is performed. The bonding test device may apply a test signal STEST having a constant current or a constant voltage to the first FPC line 272*c*. The applied test signal STEST may pass through a first path PATH1" including the first FPC line 272*c*, the first FPC bump 252*c*, the first FPC pad, the first connecting line 262*c*, the first input pad, the first input bump 232*c*, the internal ground line 236*c*, the first output bump 242*c*, the first output pad, the third connecting line 296*c*, the second output pad, the second output bump 243*c*, the fourth connecting line 283*c*, the second input bump 233*c*, the second input pad, the second connecting line 263*c*, the second FPC pad, the second FPC bump 253*c* and the second FPC line 273*c*, and then may return to the bonding test device.

The first path PATH1" of the test signal STEST may be expressed as an equivalent circuit illustrated in FIG. 7. For example, in reference to FIGS. 6 and 7, the first path PATH1" may be expressed as the equivalent circuit having a first resistance 411 of the first FPC line 272*c*, a first bonding resistance 412 between the first FPC bump 252*c* and the first FPC pad, a second resistance 413 of the first connecting line 262*c*, a second bonding resistance 414 between the first input pad and the first input bump 232*c*, a third resistance 415 of the internal ground line 236*c*, a third bonding resistance 416 between the first output pad and the first output bump 242*c*, a fourth resistance 430 of the third connecting line 296*c*, a fourth bonding resistance 426 between the second output pad and the second output bump 243*c*, a fifth resistance 425 of the fourth connecting line 283*c*, a fifth bonding resistance 424 between the second input bump 233*c* and the second input pad, a sixth resistance 423 of the second connecting line 263*c*, a sixth bonding resistance 422 between the second FPC pad and the second FPC bump 253*c*, and a seventh resistance 421 corresponding to the second FPC line 273*c*. In a case where the resistance of the first path PATH1" is higher than a predetermined value, the bonding test device may determine that the first through sixth bonding resistances 412, 414, 416, 422, 424 and 426 exceed a predetermined range, and may decide that the COG bonding between the glass substrate and the driver IC 230*c* and the FOG bonding between the glass substrate and the FPC 250*c* are poor. As described above, in the display device 200*c* according to example embodiments, since not only the COG input bonding resistances 414 and 424 but also the COG output bonding resistances 416 and 426 are measured, the COG bonding test may be further accurately performed.

In some example embodiments, the first input bump 232*c* to which the test signal STEST is applied may be a ground input bump for providing a ground voltage VSS (e.g., a system ground voltage) to the internal ground line 236*c* when the display device 200*c* operates, and at least one of the second input bump 233*c*, the first output bump 242*c* and the second output bump 243*c* may be a dummy bump.

In some example embodiments, the first output bump 242*c* and the second output bump 243*c* may be located adjacent to each other, and thereby reducing a length of the third connecting line 296*c* coupling the first output bump 242*c* to the second output bump 243*c*. In some example embodiments, at least one of the first output bump 242*c* and the second output bump 243*c* may be located at a center portion of the driver IC 230*c*. Thus, a COG output bonding test for the center portion of the driver IC 230*c* may be performed. In other example embodiments, at least one of the first output bump 242*c* and the second output bump 243*c* may be located at a left side portion or a right side portion of the driver IC 230*c*. Thus, the COG output bonding test for the left side portion or the right side portion of the driver IC 230*c* may be performed.

In still other example embodiments, the first and second output bumps 242*c* and 243*c* may be located at the center portion of the driver IC 230*c*, and the driver IC 230*c* may further include third and fourth output bumps 244*c* and 245*c* located at the left right side portion of the driver IC 230*c*, and fifth and sixth output bumps 246*c* and 247*c* located at the right side portion of the driver IC 230*c*. Thus, the COG output bonding test for the center portion, the left side portion and the right side portion of the driver IC 230*c* may be performed. For example, the COG input and output bonding test for the glass substrate and the center portion of the driver IC 230*c* may be performed using the first path PATH1". Further, the COG input and output bonding test for the glass substrate and the left side portion of the driver IC 230*c* may be performed using a second path PATH2"including the first FPC line 272*c*, the first FPC bump 252*c*, the first FPC pad, the first connecting line 262*c*, the first input pad, the first input bump 232*c*, the internal ground line 236*c*, the third output bump 244*c*, a third output pad, a fifth connecting line 297*c*, a fourth output pad, the fourth output bump 245*c*, a sixth connecting line 284*c*, a third input bump 234*c*, a third input pad, a third connecting line 264*c*, a third FPC pad, a third FPC bump 254*c* and a third FPC line 274*c*. Further, the COG input and output bonding test for the glass substrate and the right side portion of the driver IC 230*c* may be performed using a third path PATH3" including the first FPC line 272*c*, the first FPC bump 252*c*, the first FPC pad, the first connecting line 262*c*, the first input pad, the first input bump 232*c*, the internal ground line 236*c*, the fifth output bump 246*c*, a fifth output pad, an eighth connecting line 298*c*, a sixth output pad, the sixth output bump 247*c*, a ninth connecting line 285*c*, a fourth input bump 235*c*, a fourth input pad, a tenth connecting line 265*c*, a fourth FPC pad, a fourth FPC bump 255*c* and a fourth FPC line 275*c*.

As described above, in the display device 200*c* according to example embodiments, since the COG bonding test and/or the FOG bonding are performed using the ground input bump and the internal ground line 236*c*, the dedicated bumps for the boding test may be removed or reduced. Further, in the display device 200*c* according to example embodiments, since not only the COG input bonding resistance but also the COG output bonding resistance is measured, the COG bonding test may be further accurately performed.

Figure 8:
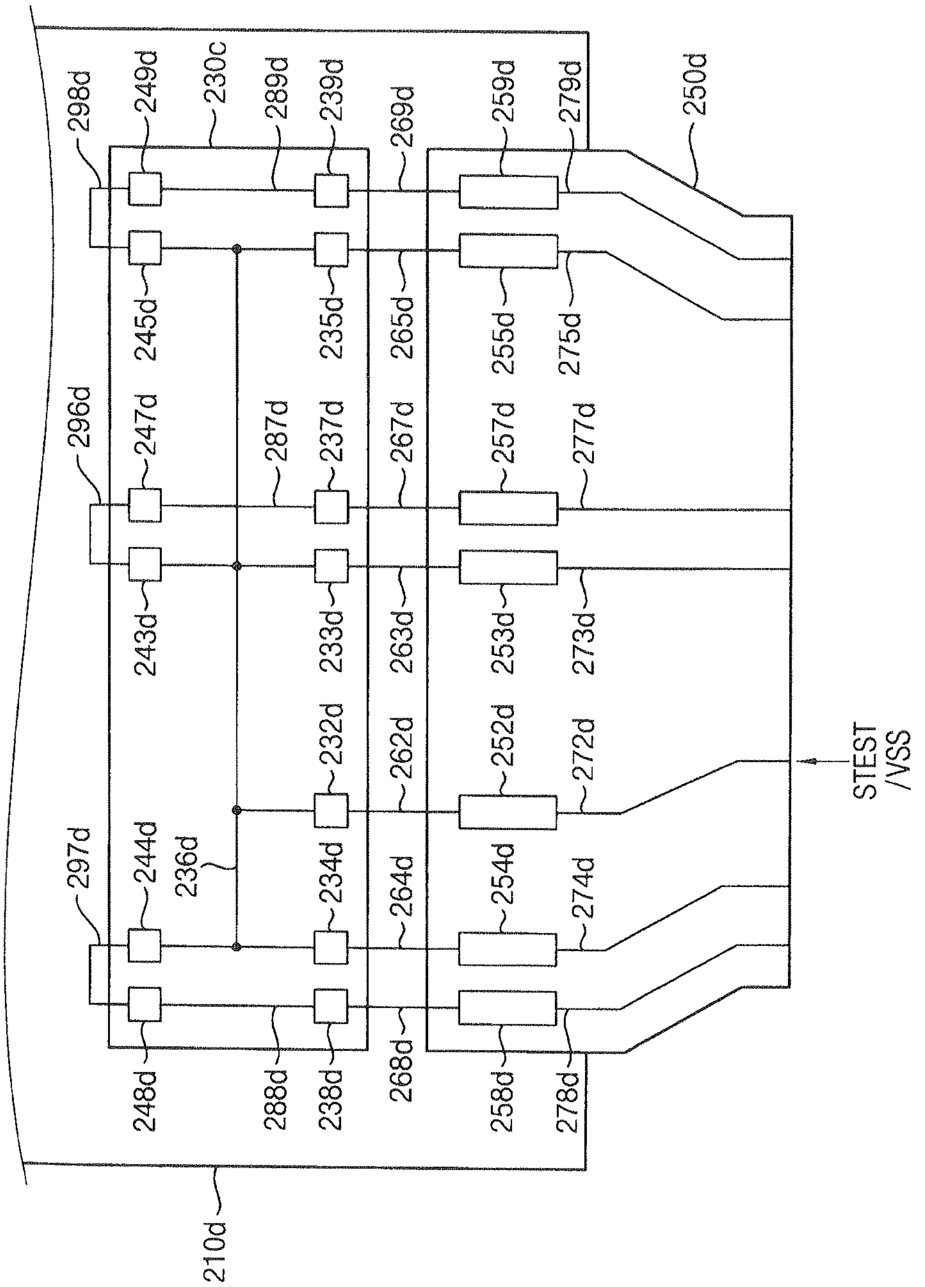
FIG. 8 is a diagram illustrating a display device in accordance with example embodiments.

FIG. 8 is a diagram illustrating a display device in accordance with example embodiments.

In reference to FIG. 8, a display device 200*d* includes a display panel 210*d*, a driver IC 230*d* and an FPC 250*d*. In the display device 200*d* of FIG. 8, a COG input bonding test may be performed by measuring a COG input bonding resistance, and a COG input and output bonding test may be further performed by measuring a COG input bonding resistance and a COG output bonding resistance.

For example, a bonding test device may perform the COG input bonding test and an FOG bonding test using a first path including a first FPC line 272*d*, a first FPC bump 252*d*, a first FPC pad, a first connecting line 262*d*, a first input pad, a first input bump 232*d*, an internal ground line 236*d*, a second input bump 233*d*, a second input pad, a second connecting line 263*d*, a second FPC pad, a second FPC bump 253*d* and a second FPC line 273*d*. Further, the bonding test device may perform the COG input and output bonding test and the FOG bonding test using a second path including the first FPC line 272*d*, the first FPC bump 252*d*, the first FPC pad, the first connecting line 262*d*, the first input pad, the first input bump 232*d*, the internal ground line 236*d*, a first output bump 243*d*, a first output pad, a third connecting line 296*d*, a second output pad, a second output bump 247*d*, a fourth connecting line 287*d*, a third input bump 237*d*, a third input pad, a fifth connecting line 267*d*, a third FPC pad, a third FPC bump 257*d* and a third FPC line 277*d*.

To perform the COG input bonding test for a left side portion of the driver IC 230*d*, the bonding test device may apply a test signal STEST to a third path including the first FPC line 272*d*, the first FPC bump 252*d*, the first FPC pad, the first connecting line 262*d*, the first input pad, the first input bump 232*d*, the internal ground line 236*d*, a fourth input bump 234*d*, a fourth input pad, a sixth connecting line 264*d*, a fourth FPC pad, a fourth FPC bump 254*d* and a fourth FPC line 274*d*. Further, to perform the COG input and output bonding test for the left side portion of the driver IC 230*d*, the bonding test device may apply the test signal STEST to a fourth path including the first FPC line 272*d*, the first FPC bump 252*d*, the first FPC pad, the first connecting line 262*d*, the first input pad, the first input bump 232*d*, the internal ground line 236*d*, a third output bump 244*d*, a third output pad, a seventh connecting line 297*d*, a fourth output pad, a fourth output bump 248*d*, an eighth connecting line 288*d*, a fifth input bump 238*d*, a fifth input pad, a ninth connecting line 268*d*, a fifth FPC pad, a fifth FPC bump 258*d* and a fifth FPC line 278*d*.

To perform the COG input bonding test for a right side portion of the driver IC 230*d*, the bonding test device may apply the test signal STEST to a fifth path including the first FPC line 272*d*, the first FPC bump 252*d*, the first FPC pad, the first connecting line 262*d*, the first input pad, the first input bump 232*d*, the internal ground line 236*d*, a sixth input bump 235*d*, a sixth input pad, a tenth connecting line 265*d*, a sixth FPC pad, a sixth FPC bump 255*d* and a sixth FPC line 275*d*. Further, to perform the COG input and output bonding test for the right side portion of the driver IC 230*d*, the bonding test device may apply the test signal STEST to a sixth path including the first FPC line 272*d*, the first FPC bump 252*d*, the first FPC pad, the first connecting line 262*d*, the first input pad, the first input bump 232*d*, the internal ground line 236*d*, a fifth output bump 245*d*, a fifth output pad, a eleventh connecting line 298*d*, a sixth output pad, a sixth output bump 249*d*, a twelfth connecting line 289*d*, a seventh input bump 239*d*, a seventh input pad, a thirteenth connecting line 269*d*, a seventh FPC pad, a seventh FPC bump 259*d* and a seventh FPC line 279*d*.

Figure 9:
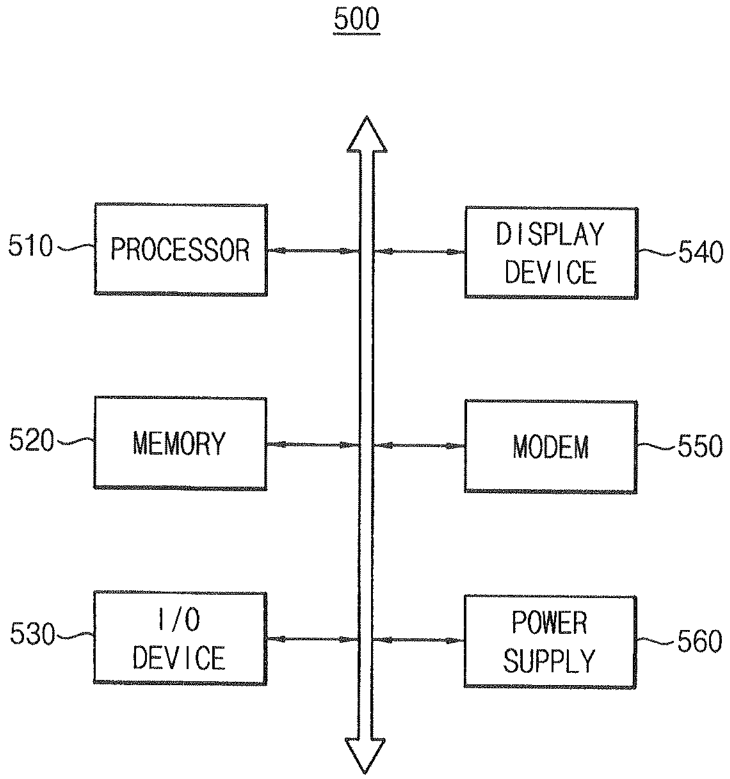
FIG. 9 is a block diagram illustrating a computing system including a display device in accordance with example embodiments.

FIG. 9 is a block diagram illustrating a computing system including a display device in accordance with example embodiments.

Referring to FIG. 9, a computing system 500 includes a processor 510 and a display device 540. In some example embodiments, the computing system 500 may further include a memory device 520, an input/output device 530, a modem 550 and a power supply 560.

The processor 510 may perform specific calculations or tasks. For example, the processor 510 may be a mobile system-on-chip (SOC), an application processor, a media processor, a microprocessor, a central process unit (CPU), a digital signal processor, or the like. The processor 510 may be coupled to the memory device 520 via an address bus, a control bus and/or a data bus. For example, the memory device 520 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. Further, the processor 510 may be coupled to an extension bus, such as a peripheral component interconnect (PCI) bus. The processor 510 may control the input/output device 530 including an input device, such as a keyboard, a mouse, a keypad, etc., and an output device, such as a printer, a speaker, etc. via the extension bus. The processor 510 may be further coupled to the display device 540. The display device 540 may perform a bonding test using a ground input bump and an internal ground line of a driver IC, thereby removing or reducing dedicated bumps for the bonding test.

Further, the processor 510 may control a storage device, such as a solid state drive, a hard disk drive, a CD-ROM, etc. via the extension bus. The modem 550 may perform wired or wireless communications with an external device. The power supply 560 may supply power to the computing system 500. In some example embodiments, the computing system 500 may further include an application chipset, a camera image processor (CIS), etc.

According to example embodiments, the computing system 500 may be any computing system including the display device 540, such as a digital television (TV), a 3D TV, a personal computer (PC), a home appliance, a laptop computer, a tablet computer, a mobile phone, a smart phone, a personal digital assistant (PDA), a portable multimedia player (PMP), a digital camera, a music player, a portable game console, a navigation device, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A display device, comprising:

a display panel including a glass substrate, a first input pad formed on the glass substrate, and a second input pad formed on the glass substrate; and a driver integrated circuit (IC) mounted on the glass substrate of the display panel using a chip-on-glass (COG) method, the driver integrated circuit including a first input bump coupled to the first input pad, a second input bump coupled to the second input pad, and an internal ground line coupled to the first and second input bumps, wherein, when a COG bonding test for the glass substrate and the driver IC is performed by a bonding test device, the first input bump of the driver IC is configured to receive a test signal from the bonding test device through the first input pad, and is configured to provide the test signal to the bonding test device through the internal ground line, the second input bump and the second input pad, and wherein, when the display device operates, the first input bump of the driver IC is configured to receive a ground voltage through the first input pad, and is configured to provide the ground voltage to the internal ground line.

2. The display device of claim 1, wherein the bonding test device performs the COG bonding test by measuring a resistance of a path of the test signal including a first bonding resistance between the first input pad and the first input bump and a second bonding resistance between the second input pad and the second input bump.

3. The display device of claim 1, wherein the second input bump of the driver IC is a ground input bump configured to receive the ground voltage through the second input pad and to provide the ground voltage to the internal ground line when the display device operates.

4. The display device of claim 1, wherein the second input bump of the driver IC is a signal input bump configured to receive a data signal through the second input pad when the display device operates.

5. The display device of claim 4, wherein the driver IC further includes a diode coupled between the internal ground line and the second input bump, and wherein the diode is configured to transfer the test signal from the internal ground line to the second input bump when the COG bonding test is performed, and is configured to prevent the data signal from being transferred from the second input bump to the internal ground line when the display device operates.

6. The display device of claim 1, wherein at least one of the first input bump and the second input bump is located at a center portion of the driver IC.

7. The display device of claim 1, wherein at least one of the first input bump and the second input bump is located at a side portion of the driver IC.

8. The display device of claim 1, wherein the second input bump is located at a center portion of the driver IC, wherein the driver IC further includes a third input bump coupled to the internal ground line and located at a left side portion of the driver IC, and a fourth input bump coupled to the internal ground line and located at a right side portion of the driver IC, and wherein the bonding test device performs the COG bonding test for the glass substrate and the center portion of the driver IC using a first path including the first input bump, the internal ground line and the second input bump, performs the COG bonding test for the glass substrate and the left side portion of the driver IC using a second path including the first input bump, the internal ground line and the third input bump, and performs the COG bonding test for the glass substrate and the right side portion of the driver IC using a third path including the first input bump, the internal ground line and the fourth input bump.

9. The display device of claim 1, wherein the display panel further includes a third input pad formed on the glass substrate, a first output pad formed on the glass substrate, a second output pad formed on the glass substrate, and a first connecting line coupling the first output pad to the second output pad, wherein the driver IC further includes a first output bump coupled to the internal ground line and the first output pad, a second output bump coupled to the second output pad, a third input bump coupled to the third input pad, and a second connecting line coupling the second output bump to the third input bump, and wherein the bonding test device performs the COG bonding test using a path including the first input pad, the first input bump, the internal ground line, the first output pad, the first connecting line, the second output pad, the second output bump, the second connecting line, the third input bump and the third input pad.

10. The display device of claim 9, wherein the bonding test device performs the COG bonding test by measuring a resistance of the path including a first bonding resistance between the first input pad and the first input bump, a second bonding resistance between the first output pad and the first output bump, a third bonding resistance between the second output pad and the second output bump, and a fourth bonding resistance between the third input pad and the third input bump.

11. The display device of claim 1, further comprising:

a flexible printed circuit (FPC) mounted on the glass substrate using a film-on-glass (FOG) method, the FPC coupled to the bonding test device when the COG bonding test is performed.

12. The display device of claim 11, wherein the display panel further includes first and second FPC pads formed on the glass substrate, and first and second connecting lines coupling the first and second input pads to the first and second FPC pads, respectively, wherein the FPC includes a first FPC bump coupled to the first FPC pad, a second FPC bump coupled to the second FPC pad, a first FPC line coupled to the first FPC bump, and a second FPC line coupled to the second FPC bump, and wherein the bonding test device performs the COG bonding test for the glass substrate and the driver IC and a FOG bonding test for the glass substrate and the FPC by applying the test signal to the first FPC line and by receiving the applied test signal through a path including the first FPC line, the first FPC bump, the first FPC pad, the first connecting line, the first input pad, the first input bump, the internal ground line, the second input bump, the second input pad, the second connecting line, the second FPC pad, the second FPC bump and the second FPC line.

13. The display device of claim 12, wherein the bonding test device performs the COG bonding test and the FOG bonding test by measuring a resistance of the path including a first bonding resistance between the first FPC pad and the first FPC bump, a second bonding resistance between the first input pad and the first input bump, a third bonding resistance between the second input pad and the second input bump, and a fourth bonding resistance between the second FPC pad and the second FPC bump.

14. A display device, comprising:

a display panel including a glass substrate, first and second input pads formed on the glass substrate, first and second output pads formed on the glass substrate, and a first connecting line coupling the first output pad to the second output pad; and a driver integrated circuit (IC) mounted on the glass substrate of the display panel using a chip-on-glass (COG) method, the driver integrated circuit including first and second input bumps respectively coupled to the first and second input pads, first and second output bumps respectively coupled to the first and second output pads, an internal ground line coupled to the first input bump and the first output bump, and a second connecting line coupling the second output bump to the second input bump, wherein, when a COG bonding test for the glass substrate and the driver IC is performed by a bonding test device, the first input bump of the driver IC is configured to receive a test signal from the bonding test device through the first input pad, and is configured to provide the test signal to the bonding test device through the internal ground line, the first output bump, the first output pad, the first connecting line, the second output pad, the second output bump, the second connecting line, the second input bump and the second input pad, and wherein, when the display device operates, the first input bump of the driver IC is configured to receive a ground voltage through the first input pad, and is configured to provide the ground voltage to the internal ground line.

15. The display device of claim 14, wherein the bonding test device performs the COG bonding test by measuring a resistance of a path of the test signal including a first bonding resistance between the first input pad and the first input bump, a second bonding resistance between the first output pad and the first output bump, a third bonding resistance between the second output pad and the second output bump and a fourth bonding resistance between the second input pad and the second input bump.

16. The display device of claim 14, wherein the first output bump and the second output bump are located adjacent to each other.

17. The display device of claim 14, wherein at least one of the first output bump and the second output bump is located at a center portion of the driver IC.

18. The display device of claim 14, wherein at least one of the first output bump and the second output bump is located at a side portion of the driver IC.

19. The display device of claim 14, wherein at least one of the second input bump, the first output bump and the second output bump is a dummy bump.

20. A bonding test system, comprising: a display device comprising:

a display panel including a glass substrate, a first input pad formed on the glass substrate, and a second input pad formed on the glass substrate, a driver integrated circuit (IC) mounted on the glass substrate of the display panel using a chip-on-glass (COG) method, the driver integrated circuit including a first input bump coupled to the first input pad, a second input bump coupled to the second input pad, and an internal ground line coupled to the first and second input bumps, and a flexible printed circuit (FPC) mounted on the glass substrate using a film-on-glass (FOG) method; and a bonding test device coupled to the FPC, the bonding test device configured to perform a COG bonding test for the glass substrate and the driver IC using a path including the first input pad, the first input bump, the internal ground line, the second input bump and the second input pad.

* * * * *